United States Patent
Chung et al.

(10) Patent No.: US 7,211,523 B2
(45) Date of Patent: May 1, 2007

(54) METHOD FOR FORMING FIELD OXIDE

(75) Inventors: Yi Fu Chung, Hsinchu (TW); Shih-Chi Lai, Hsinchu (TW); Jen Chieh Chang, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 11/204,479

(22) Filed: Aug. 15, 2005

(65) Prior Publication Data

US 2006/0094254 A1    May 4, 2006

(30) Foreign Application Priority Data

Oct. 28, 2004    (TW) .............................. 93132796 A

(51) Int. Cl.
*H01L 21/469*    (2006.01)
*H01L 21/31*    (2006.01)
(52) U.S. Cl. .............................. 438/770; 257/E21.552; 438/773
(58) Field of Classification Search ................ 438/713, 438/297, 452, 221, 362, 439, 770, 773; 257/E21.552
See application file for complete search history.

(56) References Cited

U.S. PATENT DOCUMENTS

| 4,551,910 A | * | 11/1985 | Patterson | 438/452 |
| 5,128,730 A | * | 7/1992 | Coe et al. | 257/339 |
| 5,817,581 A | * | 10/1998 | Bayer et al. | 438/770 |
| 5,972,779 A | * | 10/1999 | Jang | 438/452 |
| 5,985,738 A | * | 11/1999 | Jang et al. | 438/452 |
| 6,033,991 A | * | 3/2000 | Ramkumar et al. | 438/713 |
| 6,153,481 A | * | 11/2000 | Jang et al. | 438/297 |
| 6,440,819 B1 | * | 8/2002 | Luning | 438/444 |
| 2001/0055862 A1 | * | 12/2001 | Bevk | 438/532 |

* cited by examiner

*Primary Examiner*—Asok Kumar Sarkar
(74) *Attorney, Agent, or Firm*—Townsend and Townsend and Crew LLP

(57) ABSTRACT

A method for forming a field oxide is disclosed. In one embodiment, the method comprises providing a semiconductor structure having a substrate, a pad oxide, and a patterned barrier layer, performing a dry oxidation process to form a first field oxide on the substrate in a region not covered with the barrier layer by introducing pure dry oxygen, and performing a wet oxidation process to form a second field oxide adjacent the first field oxide by introducing hydrogen and oxygen. The method of the present invention can improve the quality and electrical property of the semiconductor device, increase the yield, and reduce the cost.

22 Claims, 6 Drawing Sheets

METHOD FOR FORMING FIELD OXIDE

CROSS-REFERENCES TO RELATED APPLICATIONS

This application claims priority from R.O.C. Patent Application No. 093132796, filed Oct. 28, 2004, the entire disclosure of which is incorporated herein by reference.

BACKGROUND OF THE INVENTION

The present invention relates to a method for forming an oxide, and more particularly to a method for forming a field oxide.

The active area of the metal oxide semiconductor (MOS) device is generally isolated with the field oxide formed by the local oxidation of silicon (LOCOS) in the manufacturing process of integrated circuit (IC) above 0.25 μm. FIGS. 1(a)–(d) are schematic diagrams showing the conventional process for forming the field oxide of the MOS device. As shown in FIG. 1(a), the first step is providing a silicon substrate 11 and forming a pad oxide 12 and a nitride film 13 such as $Si_3N_4$ on the silicon substrate 11. A photolithographic process is performed thereupon to form a patterned photoresist 14 on the nitride film 13, wherein the patterned photoresist 14 is formed via the pattern transfer of a mask to define the active area of the MOS device. As shown in FIG. 1(b), the nitride film 13 and the pad oxide 12 which are not covered with the photoresist 14 are subsequently etched and removed. As shown in FIG. 1(c), the photoresist 14 is removed and the resulted semiconductor structure is then placed into an oxidation furnace (not shown) to form a field oxide 16 with thermal oxidation. Finally, as shown in FIG. 1(d), the finished active area of the MOS device is isolated with the field oxide 16 after removing the pad oxide 12 and the nitride film 13. For isolating the neighbor active areas of the MOS device effectively, the field oxide 16 with a certain thickness is required.

With consideration of the oxidation reaction rate, the wet oxidation process is extensively used for forming the field oxide in industry nowadays. The chemical equation of the wet oxidation process is $H_2+O_2+Si \rightarrow SiO_2+H_2O$, and the reaction condition and process are shown in FIG. 2. As shown in FIG. 2, the temperature of the furnace is raised from 700–800° C. to 800–1000° C. before the wet oxidation process. Subsequently, the reaction gas like hydrogen and oxygen with a flow ratio of 5500 sccm: 3300 sccm to 2000 sccm: 2000 sccm is introduced into the oxidation furnace to oxidize the silicon substrate 11 after the temperature of the oxidation furnace comes to a steady state. Finally, the temperature of the oxidation furnace is lowered down to finish the wet oxidation process after the certain thickness of the field oxide 16 is obtained and the reaction becomes stable.

While forming the field oxide 16, the active area of the MOS device is covered with the pad oxide 12 and the nitride film 13, therefore the reaction gas cannot permeate the nitride film 13 and react with the silicon substrate 11. The gas can only react with the silicon substrate 11 not covered with the nitride film 13 in an isotropic way. Due to the speedy reaction rate of the wet oxidation process, the field oxide forming rate at 45° and 90° angle is faster than that at 0° to 30° angle to the silicon substrate 11. Hence, it is easy to form the active area with a tip 111 as shown in FIG. 1(d) and FIG. 3 after removing the pad oxide 12 and the nitride film 13. The field concentration and tip discharge are attributed to the formation of the active area with a tip 111 and thus make a breakdown of the gate oxide, and further affect the quality and electric property of the MOS device.

Therefore, it is desirable to develop a method for forming an even field oxide without tip and dealing with the conventional defects.

BRIEF SUMMARY OF THE INVENTION

Embodiments of the present invention provide a method for forming the field oxide, which overcomes the problem of forming the active area with a tip in the conventional process due to the fact that the field oxide forming rate at 45° and 90° angle is faster than that at 0° to 30° angle to the silicon substrate, and avoids the breakdown of the gate oxide of the MOS device caused by the field concentration at the tip of the active area.

A method for forming a field oxide according to one embodiment of the present invention comprises the following steps: providing a semiconductor structure having a substrate, a pad oxide, and a patterned barrier layer; performing a dry oxidation process to form a first field oxide on the substrate in a region not covered with the barrier layer by introducing pure dry oxygen; and performing a wet oxidation process to form a second field oxide adjacent the first field oxide by introducing hydrogen and oxygen.

The method for forming a field oxide according to another embodiment of the present invention comprises the following steps: providing a substrate and forming a pad oxide and a barrier layer in order thereon; performing a photolithographic process for forming a patterned mask layer on a surface of the barrier layer, wherein the mask layer is used for defining an active area of the substrate; etching the barrier layer and removing the barrier layer in a region not covered with the mask layer; performing a dry oxidation process to form a first field oxide on the substrate not covered with the barrier layer by introducing pure dry oxygen; and performing a wet oxidation process to form a second field oxide adjacent the first field oxide by introducing hydrogen and oxygen.

DETAILED DESCRIPTION OF THE INVENTION

Figure 4A:
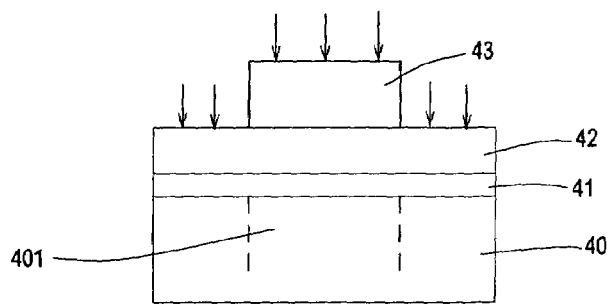
FIGS. 4(a)–(e) are schematic diagrams showing the process for forming the filed oxide according to an embodiment of the present invention.
Figure 4B:
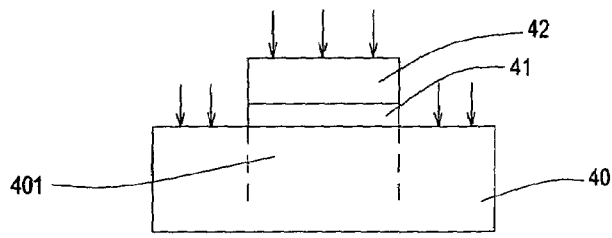

FIGS. 4(a)–(e) are schematic diagrams showing the process for forming the filed oxide according to one embodiment of the present invention. As shown in FIG. 4(a), the first step of the method for forming the field oxide is to provide a substrate 40, such as a silicon substrate, and then forming a pad oxide 41 and a barrier layer 42 on the substrate 40 in order, wherein the pad oxide 41 is used for decreasing the stress between the barrier layer 42 and the substrate 40. The barrier layer 42 is preferably a silicon nitride layer but not limited thereto. After that, a photolithographic process is performed to form a patterned photoresist 43 on the barrier layer 42, wherein the patterned photoresist 43 is formed via the pattern transfer of a mask to define the active area 401 of the MOS device. An etching process is performed thereupon to remove portions of the barrier layer 42 and the pad oxide 41 which are not covered by the photoresist 43. Thereafter, as shown in FIG. 4(b), the photoresist 43 is removed and the substrate 40 is placed into the oxidation furnace (not shown) to form a field oxide by thermal oxidation process.

Figure 4C:
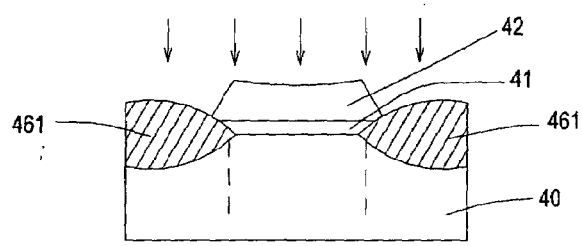
Figure 5:
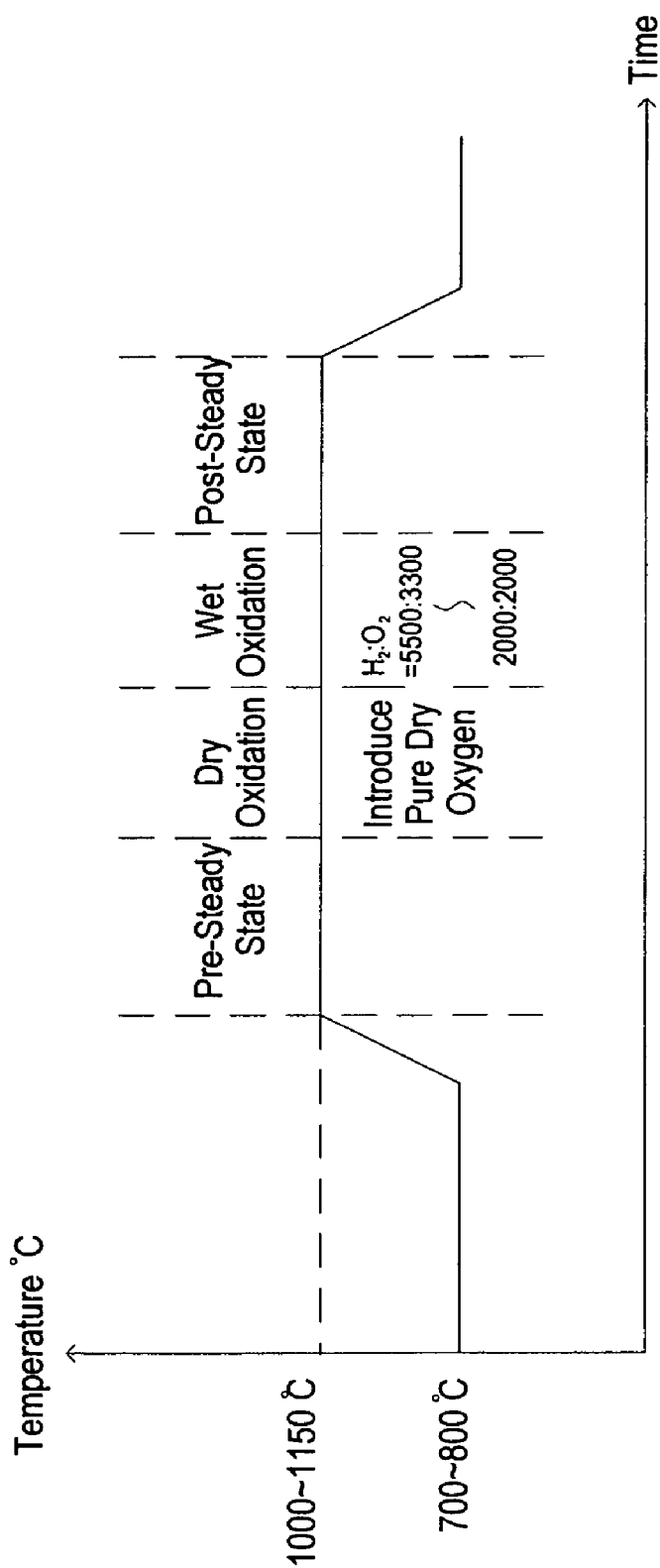
FIG. 5 is a schematic diagram showing the process of thermal oxidation process for forming the field oxidation according to an embodiment of the present invention.

In this embodiment, the thermal oxidation process comprises a dry oxidation process and a wet oxidation process. The detailed steps of the thermal oxidation process are described in connection with FIG. 5 for illustration. First the reaction temperature of the oxidation furnace is raised to about 1000–1150° C., and then the pure dry oxygen is introduced to perform a dry oxidation process as shown in FIG. 4(b) after the temperature of the oxidation furnace comes to a steady state. The field oxide 461 such as silicon dioxide is formed on the substrate 40 in a region not covered with the barrier layer 42 as shown in FIG. 4(c), with the reaction equation of $O_2+Si \rightarrow SiO_2$. In some embodiments of the present invention, the TEL IW-6D machine produced by TOKYO ELECTRON LIMITED is used to perform the dry oxidation process. The field oxide 461 with a thickness substantially of about 1000–5000 Å (preferably about 2500 Å) is formed under about 1000–1150° C. and 1 atmosphere (atm) for about 100–800 minutes (preferably about 300–500 minutes).

Figure 4D:
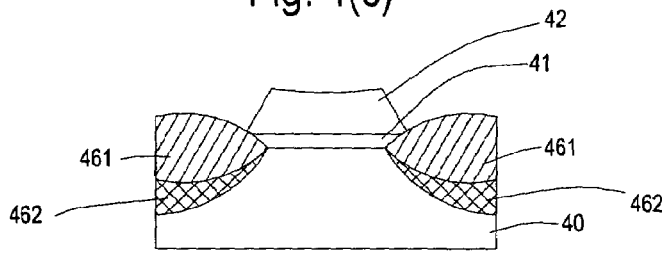

The reaction gas including hydrogen and oxygen is introduced into the oxidation furnace to perform a wet oxidation process for forming a field oxide 462 such as silicon dioxide adjacent the field oxide 461 after the field oxide 461 comes to a predetermined thickness. The reaction equation is $H_2+O_2+Si \rightarrow SiO_2+H_2O$. In some embodiments of the present invention, the TEL IW-6D machine produced by TOKYO ELECTRON LIMITED is used to perform the wet oxidation process. The field oxide 462 with a thickness substantially of about 1000–3000 Å (preferably about 1000 Å) is formed under about 1000–1150° C. and 1 atmosphere (atm) for about 5–30 minutes (preferably about 12 minutes), wherein the flow ratio of hydrogen to oxygen is 5500 sccm: 3300 sccm to 2000 sccm: 2000 sccm. Next, the semiconductor structure as shown in FIG. 4(d) is moved out from the oxidation furnace after the field oxide 462 with a predetermined thickness is formed and the oxidation furnace comes to a steady state. Finally, the process for forming the field oxide of the MOS device (not shown) is completed after the pad oxide 41 and the barrier layer 42 are removed as shown in FIG. 4(e).

Figure 1A:
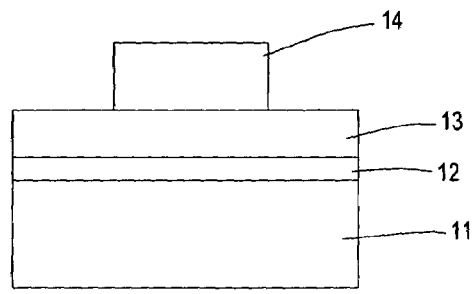
FIGS. 1(a)–(d) are schematic diagrams showing the conventional process for forming the field oxide of the MOS device.
Figure 1B:
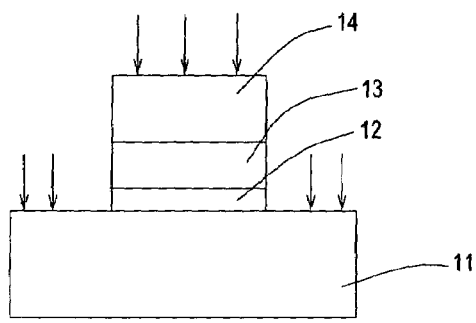
Figure 1C:
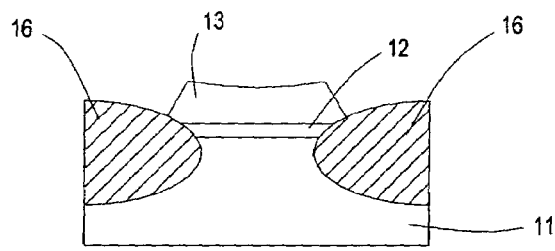
Figure 1D:
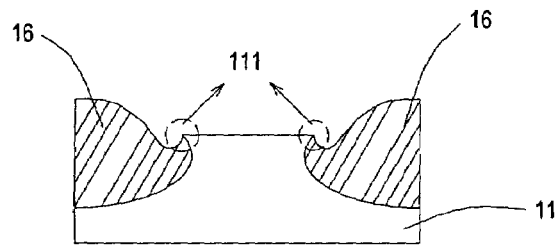
Figure 2:
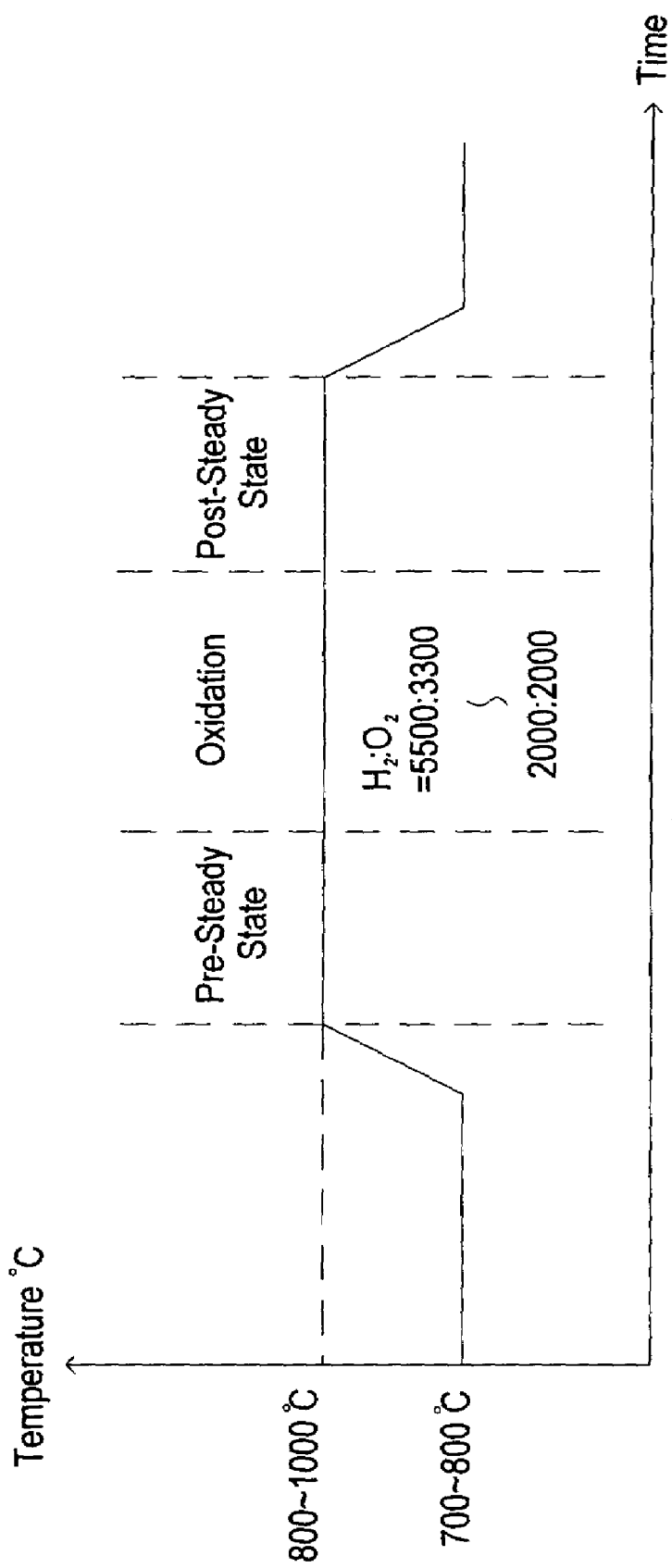
FIG. 2 is a schematic diagram showing the conventional wet oxidation process.
Figure 3:
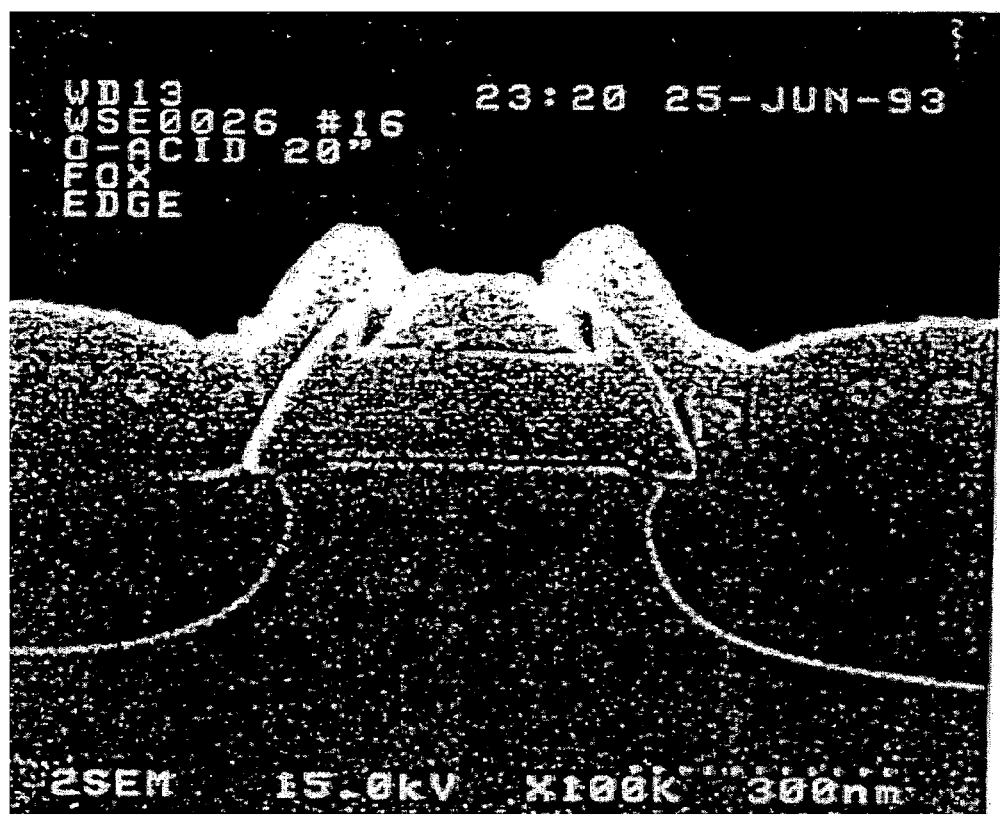
FIG. 3 is an SEM diagram showing the active area with tips formed by the conventional wet oxidation process.
Figure 4E:
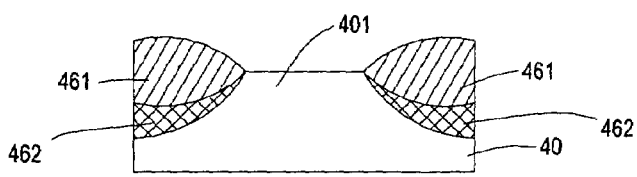
Figure 6:
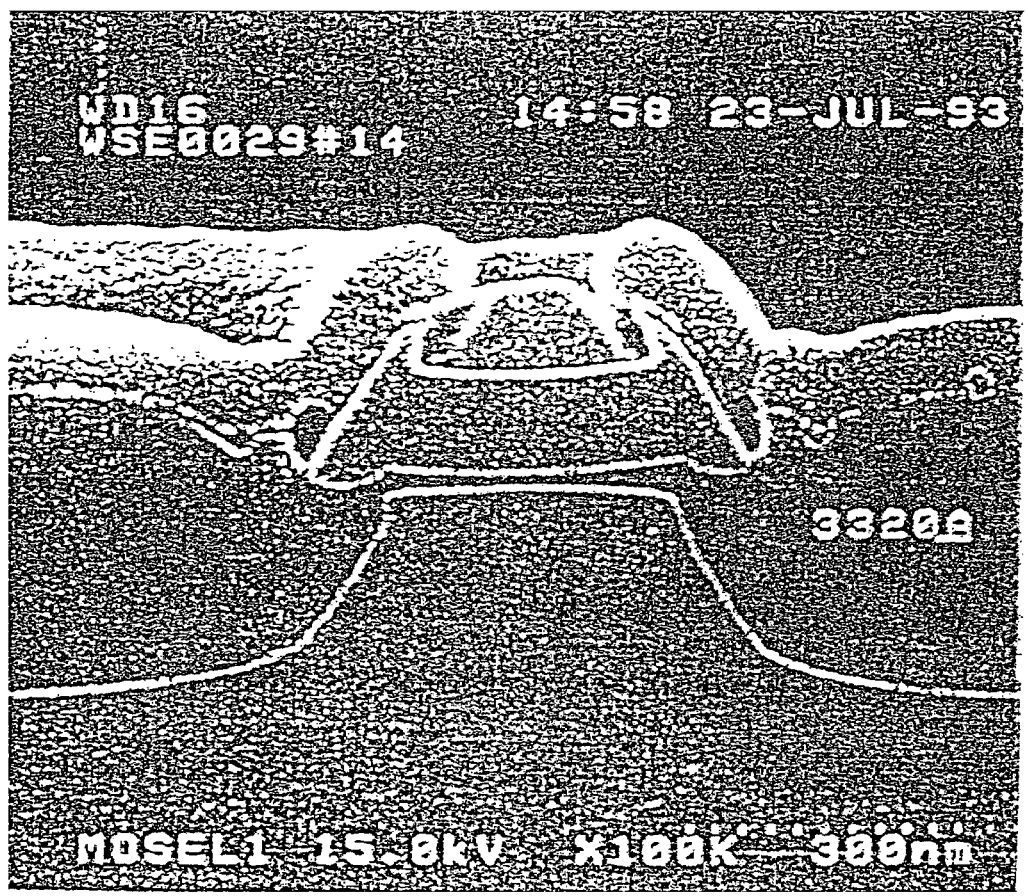
FIG. 6 is an SEM diagram showing the active area formed by the thermal oxidation process according to an embodiment of the present invention.

As shown in FIG. 4(e), the field oxide (such as $SiO_2$) forming rate at 45° and 90° to the substrate 40 (such as silicon substrate) is retarded while pure dry oxygen is introduced into the oxidation furnace and reacts with the substrate 40 not covered with the barrier layer 42 at high temperature (1000–1150° C.); therefore the formation of the active area 401 with a tip is avoided effectively. As shown in FIG. 6, the even active area 401 of the MOS device without tip is formed, so the situation of tip discharge resulting from the conventional structure shown in FIG. 1(d) can be prevented. Hence the breakdown voltage of the gate oxide (not shown) in the MOS device is improved.

The field oxide 461 and 462 are formed by a local oxidation of silicon (LOCOS) process but not limited thereto. The present invention is also applicable to all processes for forming the adjacent oxidation layer. The difference between the reaction rates of the dry and wet oxidation processes is used to form an even oxidation layer, so as to avoid the electric leakage of the active area 401 of the MOS device and improve the breakdown voltage of the gate oxide. Therefore the quality and the electric property of the MOS device are ameliorated with the process of the present invention.

In addition, the dry and wet oxidation processes are performed in the same oxidation furnace at the same reaction temperature. The pure dry oxygen is introduced into the oxidation furnace to perform the dry oxidation process for forming the first field oxide 461 with a predetermined thickness, and then the hydrogen and oxygen are introduced instead of the pure dry oxygen to perform the wet oxidation process and accelerate the formation rate of the second field oxide 462 to achieve a desired thickness. Therefore the repeats of raising and lowering temperature of the oxidation furnace are avoided, so that the yield is increased and the cost is reduced at the same time.

To sum up, the method for forming the field oxide of the present embodiment is to perform the dry oxidation process by introducing pure dry oxygen for reacting with the silicon substrate not covered with the barrier layer at high temperature. Because the reaction rate of the dry oxidation process is slow, an even field oxide is formed. After that, the hydrogen and oxygen is introduced to perform the wet oxidation process and accelerate the reaction rate for forming the field oxide to achieve a desired thickness. Accordingly, the formation of active area with a tip is inhibited, and thus the breakdown voltage of the gate oxide and the quality and electric property of the MOS device are improved. Moreover, the method for forming the field oxide of the present embodiment is performed in the same oxidation furnace at the same reaction temperature, and hence the repeats of raising and lowering temperature of the oxidation furnace is avoided, so as to increase the yield and reduce the cost.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for forming a field oxide, comprising:
    providing a semiconductor structure having a substrate, a pad oxide, and a patterned barrier layer;
    performing a dry oxidation process to form a first field oxide on said substrate in a region not covered with said barrier layer by introducing dry oxygen, the first field oxide having a first reaction rate;
    performing a wet oxidation process to form a second field oxide adjacent said first field oxide by introducing hydrogen and oxygen, the wet oxidation process being performed after the dry oxidation process, and the second field oxide having a second reaction rate;
    wherein the first reaction rate at 45° and at 90° angles relative to said substrate is slower than the second reaction rate at 45° and at 90° angles relative to said substrate so that the first field oxide has an even top surface.

2. The method for forming a field oxide according to claim 1 wherein said substrate is a silicon substrate.

3. The method for forming a field oxide according to claim 1 wherein said barrier layer is a silicon nitride layer.

4. The method for forming a field oxide according to claim 1 wherein said dry oxidation process and said wet oxidation process are performed in the same oxidation furnace.

5. The method for forming a field oxide according to claim 1 wherein said first field oxide and said second field oxide are silicon dioxides with thicknesses from about 1000 to 5000 Å and about 1000 to 3000 Å, respectively.

6. The method for forming a field oxide according to claim 1 wherein said dry oxidation process and said wet oxidation process are performed for about 100 to 800 minutes and about 5 to 30 minutes, respectively.

7. The method for forming a field oxide according to claim 1 wherein said dry oxidation process and said wet oxidation process are performed at about 1000 to 1150° C.

8. The method for forming a field oxide according to claim 1 wherein said introduced hydrogen and oxygen have a flow ratio of about 5500 sccm: 3300 sccm to about 2000 sccm: 2000 sccm.

9. The method for forming a field oxide according to claim 1 wherein said first field oxide and said second field oxide are formed by a local oxidation of silicon (LOCOS) process.

10. The method of claim 1, wherein the first field oxide lies over the second field oxide.

11. A method for forming a field oxide, comprising:
providing a substrate and forming a pad oxide and a barrier layer in order thereon;
performing a photolithographic process for forming a patterned mask layer on a surface of said barrier layer, wherein said mask layer is used for defining an active area of said substrate;
etching said barrier layer and removing said barrier layer in a region not covered with said mask layer;
performing a dry oxidation process to form a first field oxide on said substrate in a region not covered with said barrier layer by introducing dry oxygen, the first field oxide having a first reaction rate; and
performing a wet oxidation process to form a second field oxide adjacent said first field oxide by introducing hydrogen and oxygen, the wet oxidation process being performed after the dry oxidation process, and the second field oxide having a second reaction rate;
wherein the first reaction rate at 45° and at 90° angles relative to said substrate is slower than the second reaction rate at 45° and at 90° angles relative to said substrate so that the first field oxide has an even top surface.

12. The method for forming a field oxide according to claim 11 wherein said substrate is a silicon substrate.

13. The method for forming a field oxide according to claim 11 wherein said barrier layer is a silicon nitride layer.

14. The method for forming a field oxide according to claim 11 wherein said mask layer is a photoresist.

15. The method for forming a field oxide according to claim 11 wherein said dry oxidation process and said wet oxidation process are performed in the same oxidation furnace.

16. The method for forming a field oxide according to claim 11 wherein said first field oxide and said second field oxide are silicon dioxides with thicknesses from about 1000 to 5000 Å and about 1000 to 3000 Å, respectively.

17. The method for forming a field oxide according to claim 11 wherein said dry oxidation process and said wet oxidation process are performed for about 100 to 800 minutes and about 5 to 30 minutes, respectively.

18. The method for forming a field oxide according to claim 11 wherein said dry oxidation process and said wet oxidation process are performed at about 1000 to 1150° C.

19. The method for forming a field oxide according to claim 11 wherein said introduced hydrogen and oxygen have a flow ratio of about 5500 sccm: 3300 sccm to about 2000 sccm: 2000 sccm.

20. The method for forming a field oxide according to claim 11 wherein said first field oxide and said second field oxide are formed by a local oxidation of silicon (LOCOS) process.

21. The method for forming a field oxide according to claim 11 wherein said dry oxygen is pure dry oxygen.

22. The method of claim 11, wherein the first field oxide lies over the second field oxide.

* * * * *